(12) United States Patent
Erickson et al.

(10) Patent No.: US 11,756,861 B2
(45) Date of Patent: Sep. 12, 2023

(54) THERMAL PACKAGING WITH FAN OUT WAFER LEVEL PROCESSING

(71) Applicant: Cisco Technology, Inc., San Jose, CA (US)

(72) Inventors: Ashley J. M. Erickson, Danville, CA (US); Matthew J. Traverso, Saratoga, CA (US); Sandeep Razdan, Burlingame, CA (US); Joyce J. M. Peternel, Morgan Hill, CA (US); Aparna R. Prasad, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/663,072

(22) Filed: May 12, 2022

(65) Prior Publication Data
US 2022/0278022 A1  Sep. 1, 2022

Related U.S. Application Data

(62) Division of application No. 16/836,825, filed on Mar. 31, 2020, now Pat. No. 11,373,930.

(51) Int. Cl.
| | |
|---|---|
| *H01L 23/473* | (2006.01) |
| *H01L 21/48* | (2006.01) |
| *H01L 21/683* | (2006.01) |
| *H01L 23/00* | (2006.01) |
| *H01L 21/78* | (2006.01) |
| *H01L 23/544* | (2006.01) |

(52) U.S. Cl.
CPC ........ *H01L 23/473* (2013.01); *H01L 21/4803* (2013.01); *H01L 21/6835* (2013.01); *H01L 21/78* (2013.01); *H01L 23/544* (2013.01); *H01L 24/32* (2013.01); *H01L 24/83* (2013.01); *H01L 24/97* (2013.01); *H01L 2221/68345* (2013.01); *H01L 2223/54426* (2013.01); *H01L 2224/32225* (2013.01)

(58) Field of Classification Search
CPC ..... H01L 23/473; H01L 21/78; H01L 23/544; H01L 21/6835; H01L 24/97; H01L 24/32; H01L 24/83; H01L 21/4803; H01L 2224/32225; H01L 2221/68345; H01L 2223/54426
USPC ........................................................ 257/714
See application file for complete search history.

(56) References Cited

U.S. PATENT DOCUMENTS

| | | | | |
|---|---|---|---|---|
| 6,404,634 B1* | 6/2002 | Mann | ................... | H01L 23/3672 257/722 |
| 7,492,043 B2* | 2/2009 | Choi | ..................... | H01L 25/072 257/738 |
| 7,663,095 B2* | 2/2010 | Wong | .................... | G01J 1/0209 250/226 |
| 8,927,345 B2* | 1/2015 | Yap | ................... | H01L 23/49861 438/618 |

(Continued)

*Primary Examiner* — Vu A Vu
(74) *Attorney, Agent, or Firm* — Patterson + Sheridan, LLP

(57) ABSTRACT

An opto-electronic package is described. The opto-electronic package is manufactured using a fan out wafer level packaging to produce dies/frames which include connection features. Additional structures such as heat exchanged structures are joined to a connection component and affixed to packages, using the connection features, to provide structural support and heat exchange to heat generating components in the package, among other functions.

10 Claims, 9 Drawing Sheets

(56) References Cited

U.S. PATENT DOCUMENTS

| | | | |
|---|---|---|---|
| 9,209,048 B2 * | 12/2015 | Huang | H01L 21/563 |
| 9,318,410 B2 * | 4/2016 | De Cecco | H01L 23/42 |
| 10,224,254 B2 * | 3/2019 | Chen | H01L 24/20 |
| 10,561,040 B1 * | 2/2020 | Lunsman | H05K 7/20272 |
| 10,937,717 B2 * | 3/2021 | Schroeder | H05K 7/20218 |
| 11,335,570 B2 * | 5/2022 | Koduri | H01L 23/49524 |
| 2006/0131734 A1 * | 6/2006 | Kummerl | H01L 23/4334 |
| | | | 257/E23.092 |
| 2013/0314877 A1 * | 11/2013 | Watanabe | H01L 23/562 |
| | | | 257/687 |
| 2018/0005984 A1 * | 1/2018 | Yu | H01L 25/50 |

* cited by examiner

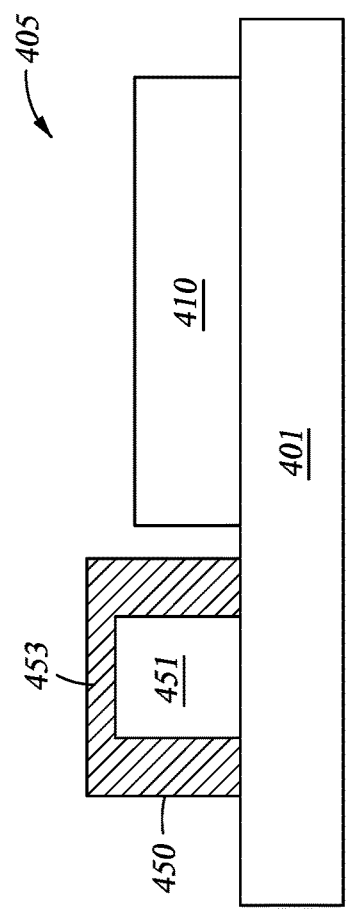
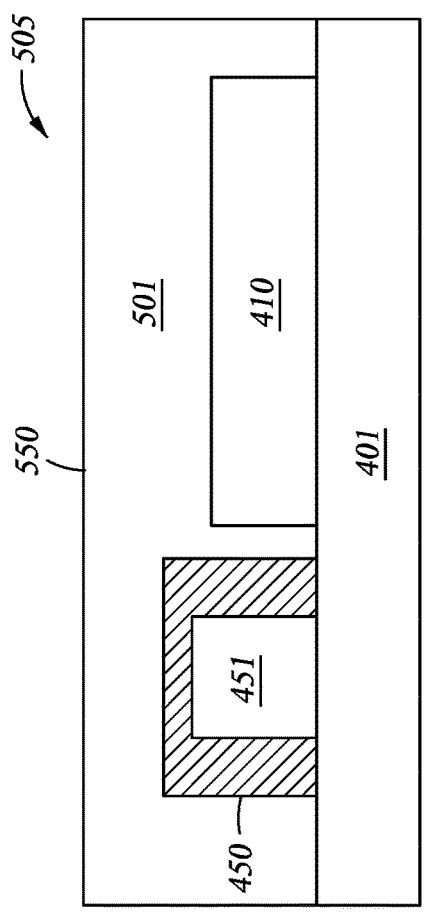
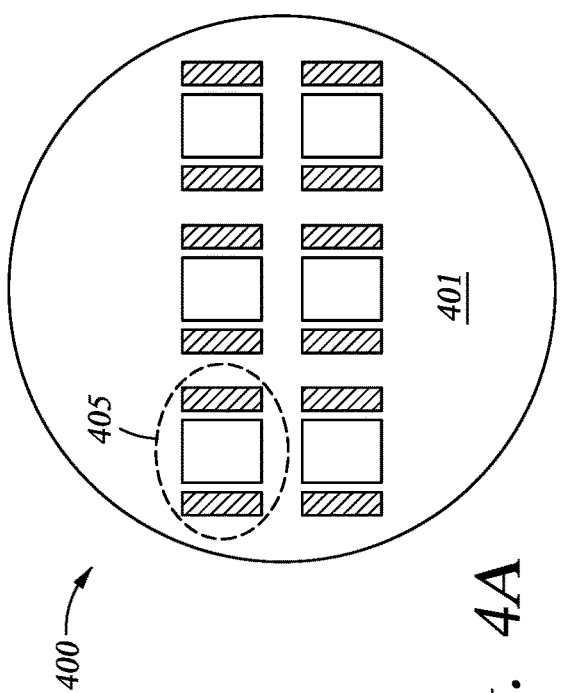
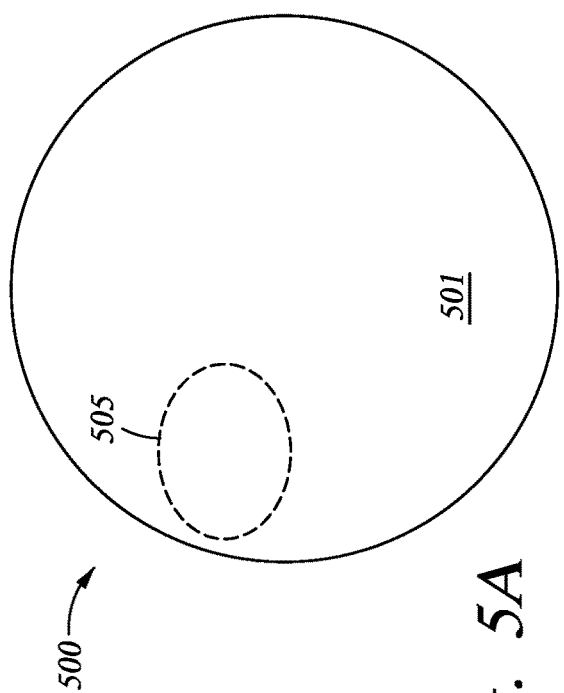
Fig. 4A
Fig. 4B
Fig. 5A
Fig. 5B

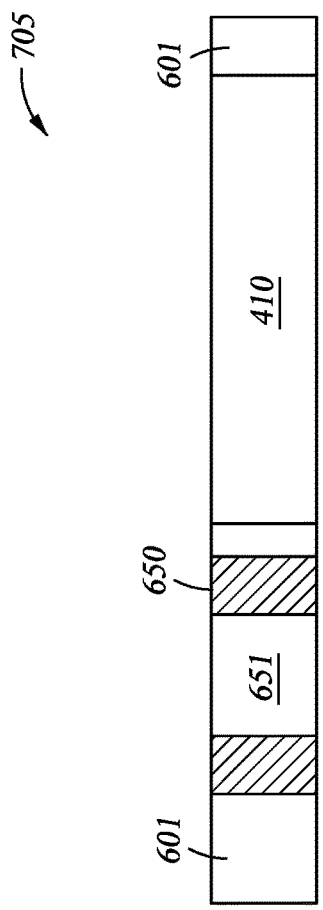
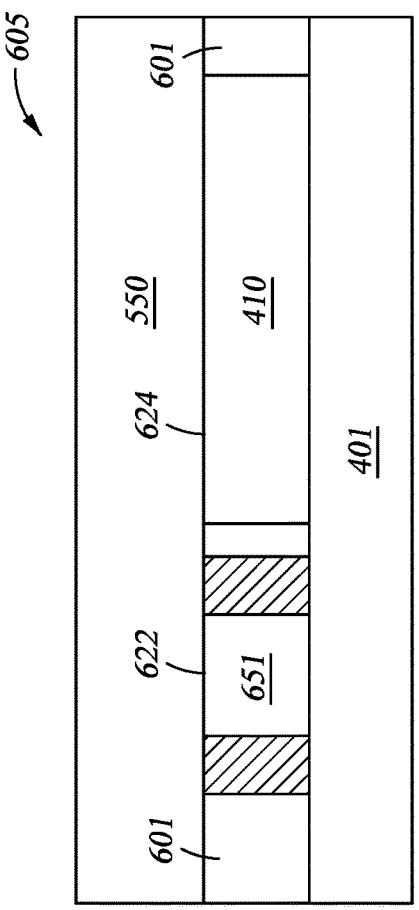
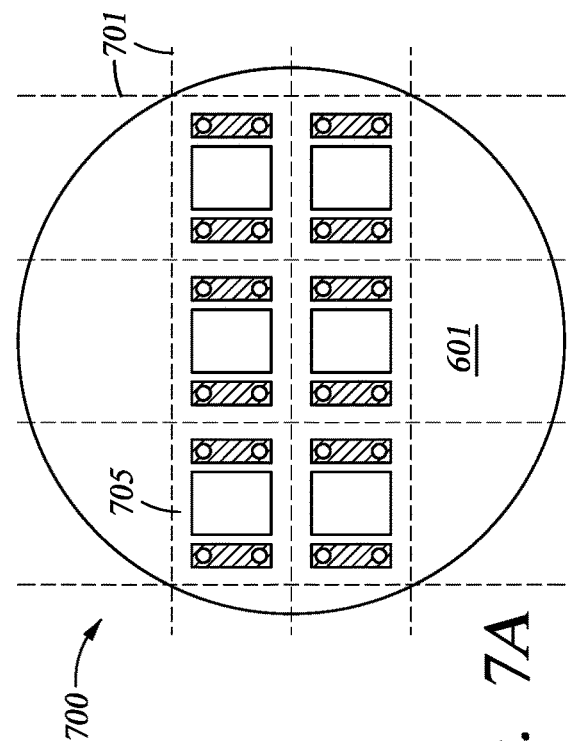
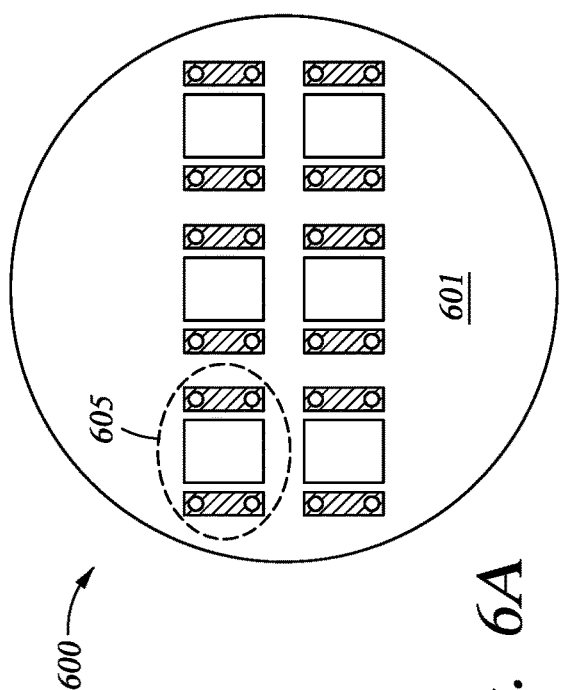

US 11,756,861 B2

THERMAL PACKAGING WITH FAN OUT WAFER LEVEL PROCESSING

CROSS-REFERENCE TO RELATED APPLICATIONS

This application is a divisional of co-pending U.S. patent application Ser. No. 16/836,825 filed Mar. 31, 2020. The aforementioned related patent application is herein incorporated by reference in its entirety.

TECHNICAL FIELD

Embodiments presented in this disclosure generally relate to streamlining the addition of mechanical connection features and structures to secure thermal structures and other additional structures in electronic and optical packages.

BACKGROUND

Electronics and optical components are often joined together to provide connectivity between various other electronic and optical components creating electronic and optical packages. These packages frequently include parts or structures in addition to the electronic or optical components. These additional structures help to ensure proper functioning of the various electronic or optical components in the packages and offer structural support to fragile packages. For example, the electronic and optical packages may include the addition of heat sinks, mechanical supports, clamps, housings, and other structures around the chips and boards in the packages. These additional parts are useful to provide mechanical stability, pass necessary reliability testing, and enable adequate cooling and heat transfer.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-B illustrate various views of a first phase of fabrication of an electronic assembly, according to embodiments described herein.

FIGS. 5A-B illustrate various views of a second phase of fabrication of an electronic assembly, according to embodiments described herein.

FIGS. 6A-B illustrate various views of a third phase of fabrication of an electronic assembly, according to embodiments described herein.

FIGS. 7A-B illustrate various views of a fourth phase of fabrication of an electronic assembly, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1A:
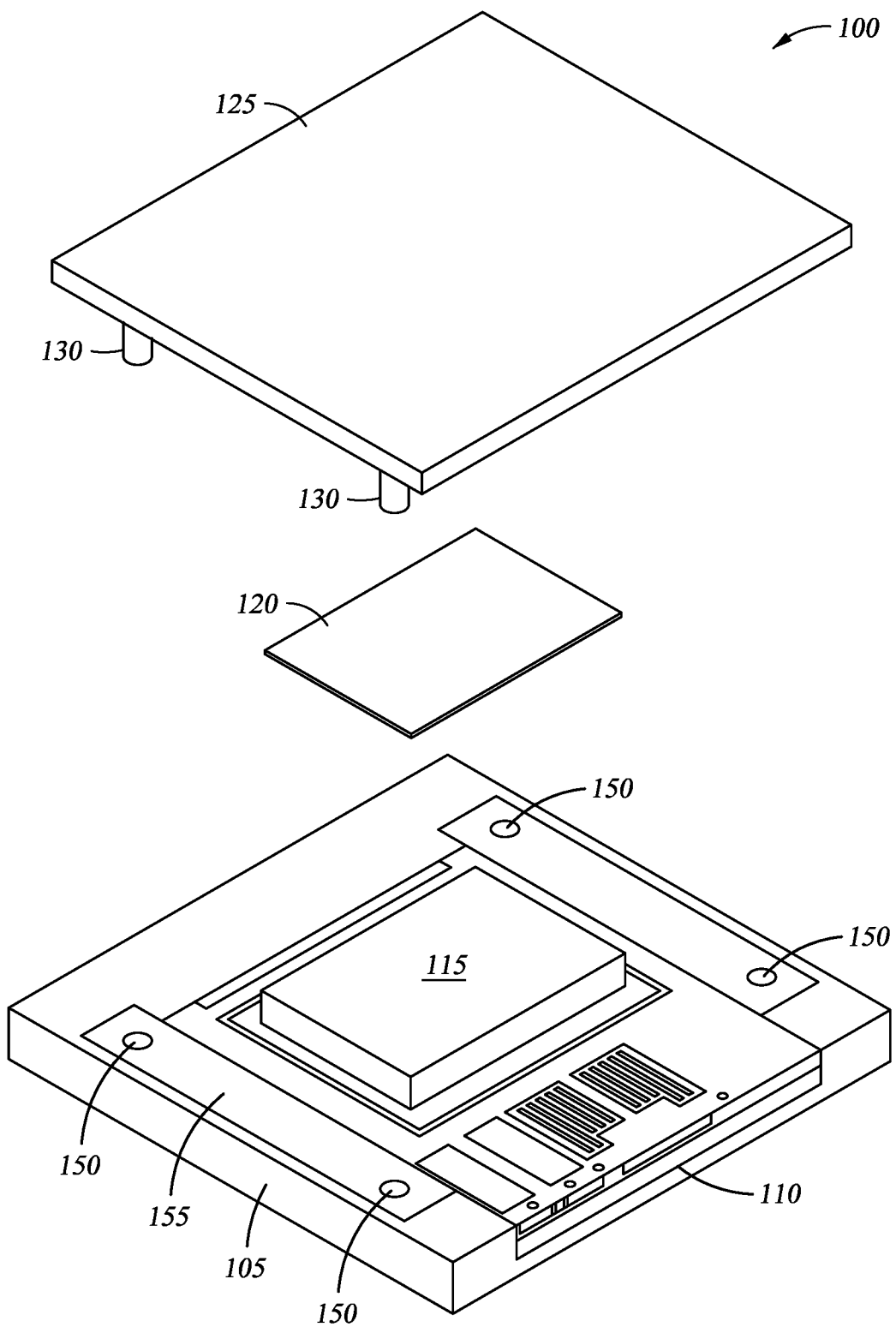
FIG. 1A illustrates an expanded view of an example electronic assembly, according to embodiments described herein.

One general aspect includes an electronic package. The electronic package includes a framing component with at least one attachment feature within the framing component, where the at least one attachment feature includes a positioning feature. The electronic package also includes a heat generating component affixed to the framing component and a heat exchange component. The heat generating component may include at least one mechanical feature, where the at least one mechanical feature is positioned within the at least one attachment feature to join the heat exchange component to the framing component, where the positioning feature positions the heat exchange component above the heat generating component to provide heat exchange to the heat generating component.

One example embodiment includes an electronic package. The electronic package includes a framing component which includes at least two components embedded in the framing component, where the at least two components includes at least one attachment feature within the framing component. The at least two components also includes a heat generating semiconductor chip and a heat exchange component including at least one mechanical feature, where the at least one mechanical feature mates with the at least one attachment feature to join the heat exchange component to the framing component and positions the heat exchange component to provide heat exchange to the heat generating semiconductor chip.

One example embodiment includes a system of one or more computers and manufacturing components configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions such as a method for manufacturing an electronic package. The method includes affixing a die element and at least one attachment feature to a carrier layer, where the at least one attachment feature includes a positioning feature; forming a framing layer by covering the die element and the at least one attachment feature with a framing mold; removing a portion of the framing mold, where the removal of the portion exposes a bottom side of the die element and a bottom side of the at least one attachment feature; removing the carrier layer to form a die may include the die element, the at least one attachment feature, and the framing layer; affixing a heat generating component to the die element; and affixing a heat exchange component may include at least one mechanical feature to the at least one attachment feature, where the at least one mechanical feature is positioned within the at least one attachment feature to join the heat exchange component to the die, where the positioning feature positions the heat exchange component above the heat generating component to provide heat exchange to the heat generating component. Other embodiments of this aspect include corresponding systems, apparatus, and computer programs recorded on one or more computer storage devices, each configured to perform the actions of the methods.

EXAMPLE EMBODIMENTS

As described above, electronic and optical packages are frequently created to provide connections between various electronic and optical components in the packages. These electronic and optical components serve a useful purpose when the packages are in use, such as providing network connections between electronic devices and fiber optic communication systems, among other examples. In many cases, the electronic and optical packages include additional structures (i.e., components that are added in relation to the optical and electronic components) such as heat sinks, mechanical supports, clamps, housings, and other structures around or added to chips, boards, and other electrical and/or optical components in the packages. These additional structures enable important functions for the packages such as serving as a housing or shield for the packages and providing cooling and heat transfer to the packages. For example, without the cooling functions provided by additional structures such as a heat sink, the optical and electronic packages can overheat, causing reduced performance or damage to the packages.

These additional structures are often secured to the packages using mechanical connection features formed in the packages. However, adding the mechanical connection features such as holes and slots directly onto photonics dies and/or electronics boards using etching, drilling, or mechanical pick and place with epoxy bonding is expensive and time consuming. Additionally, the fragile components of the packages may be easily damaged during the addition of mechanical features when using mechanical etching and drilling processes. The time and monetary costs, as well as the increased likelihood of damage, increases the total investment for each package.

For example, etching and drilling into dies and boards can be challenging due to mechanical tolerance limitations (e.g., limited control of hole position, depth, and size) and also due to the risk of causing cracks or damage on the components. Additionally, some processes such as deep reactive ion etching (DRIE) are limited to producing holes/mechanical features of up to a few hundred microns deep and are not suitable to create features that can support the addition of mechanical structures.

Also as described above, adding additional structures such as heat sinks using pick and place with epoxy bonding requires accurate placement tools which are costly, challenging to use, and time-consuming, resulting in large capital and time expenses for each electronic or optical package.

The assemblies and methods described herein use Fan Out Wafer Level Packaging (FOWLP) processes to streamline the addition of other structures to the packages such as the additional structures described above. The use of FOWLP processes provide a method to add mechanical connection and other features directly to a reconstituted die without the introduction of mechanical processes to fragile optical components. The resulting assemblies provide mechanical connection features which allow for the additional structures to be attached to the electronic and optical packages to ensure the proper functioning of the electronic and optical packages, without greatly increasing the cost of the packages.

FIG. 1A illustrates an expanded view of an example electronic package, package 100, according to embodiments described herein. The package 100 (or electronic assembly), includes a framing component such as frame 105, a die element 110, a heat generating component 115, and an additional structural component, such as structure 125. In some examples, the frame 105 is a FOWLP frame or reconstituted die formed from an epoxy material which is cured to form reconstituted dies, where frame 105 provides a frame/support for the die element 110 and the other components formed or attached to the frame 105 as described herein. The framing component is formed in processes described in relation to FIGS. 4A-6B.

In some examples, the die element 110 is embedded in the frame 105 and includes a Photonic Integrated Circuit (PIC) including optical features and/or an Electrical Integrated Circuit (EIC). In some examples, the heat generating component 115 is a heat generating semiconductor chip such as an EIC disposed on the die element 110 where the die element 110 is a PIC and the EIC (e.g., heat generating component 115) are connected to function together. In some examples, the die element 110 is an optical device that may operate to amplify, dim, extinguish, phase shift, switch, modulate, direct optical signals, and convert optical signals to an electrical signal for use by an EIC integrated with or connected to the die element 110. The EIC is an electrical circuit that operates with the package 100 described herein to send or receive and process optical and other types of signals. The EIC (e.g., the heat generating component 115) may include a processor, memory storage devices, communications interfaces to other electrical circuits or equipment, and components to drive or receive optical signals via an optical connection assembly including the die element 110. The various components of the EIC in turn produce heat during the function of the EIC, such that without heat mitigation, the EIC and the PIC (the die element 110) will cease to function properly and/or be damaged by the generated heat.

Figure 1B:
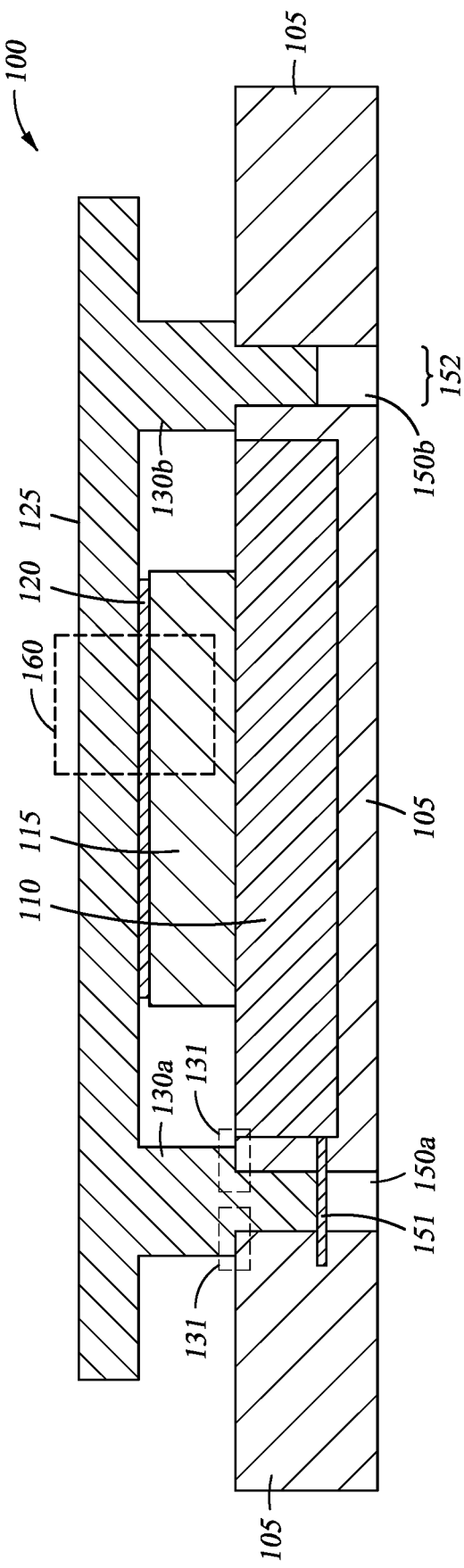
FIG. 1B illustrates a cross-section side view of an example electronic assembly, according to embodiments described herein.
Figure 1C:
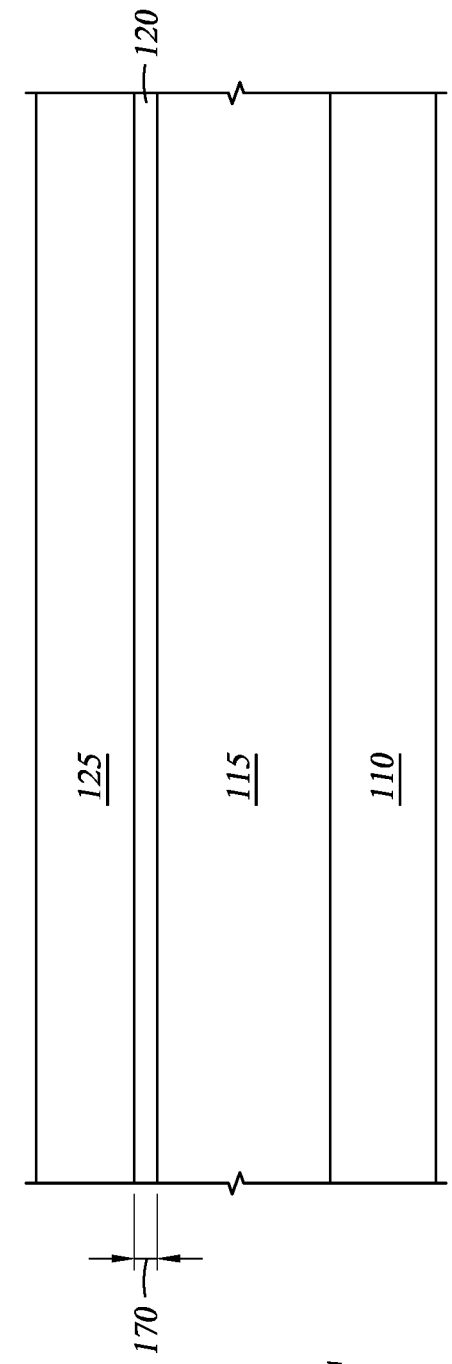
FIG. 1C illustrates a cross-section side view of a subsection of example electronic assembly, according to embodiments described herein.

In some examples, the package 100 also includes a thermal interface material (TIM), such as TIM 120 disposed between the heat generating component 115 and the structure 125 where the TIM 120 provides a thermal connection to enhance heat exchange between the heat generating component 115 and the structure 125 (e.g., a heat exchanger, heat sink, etc.) as further described in relation to FIGS. 1B-C.

The package 100 also includes attachment features 150 which provide a connection point for any additional structures such as the structure 125. In some examples, the attachment features 150 include prefabricated and/or mechanically patterned components such as drilled, etched, laser drilled, saw cut, etc. holes/slots in the frame 105, where the holes/slots are added in the FOWLP process described in relation to FIGS. 4A-7B below. The attachment features 150 may be formed in preformed components 155 prior to being added to and/or embedded in the frame 105 for ease of fabrication. The package may include one, two, or three or more attachment features 150 in one or more preformed components similar to the preformed components 155, as described herein.

In some examples, the attachment features 150 are embedded in the frame 105 to provide a mechanical connection point for additional mechanical structures such as the structure 125 (e.g., a housing or shelf, a heat exchange component, a clamp piece, etc.). The structure 125 includes mechanical attachment portion such as the mechanical features 130 that interact with the attachment features 150 to join the structure 125 to the frame 105. In some examples, the mechanical features 130 are positioned and attached to the framing component, the frame 105, and the attachment features 150 using a simple alignment system, where the precise alignment of the structure 125 to the rest of the package 100 is accomplished by the design or features of the attachment features 150 and the mechanical features 130 as described in relation to FIGS. 1B-C. In some examples, the mechanical features 130 are further held in place or joined to the attachment features 150 by an additional joining material such as an adhesive, an epoxy, solder, etc. applied to the mechanical features 130 and the attachment features 150.

While package 100 described in relation to FIG. 1A includes a single combination of the frame 105, die element 110, and structure 125, the package 100 may include a frame with multiple dies, structural components, and photonic/electronic elements, etc. Furthermore, while described primarily in relation to a heat exchange function of the structure 125, the structure 125 may include any additional mechanical structures such as a housing, a shield, a clamp to secure optical devices to the package 100, among others. When the structure 125 functions as a heat exchanger or heat sink, the placement of the structure 125 is controlled to a specific degree of accuracy to ensure that heat exchange is possible as described in relation to FIGS. 1B and 1C.

FIG. 1B illustrates a cross-section side view of an example electronic assembly, according to embodiments described herein. The package 100 shown in FIG. 1B is a non-expanded view of the component described FIG. 1A, where the structure 125 is shown attached/affixed/joined to attachment features 150a and 150b (where the attachment features 150a and 150b are included in the attachment features 150 shown in FIG. 1A). In some examples, the attachment features 150a and 150b include positioning features such as a depth 151 and/or a diameter 152. These positioning features may be collocated in each of the attachment features 150a and 150b. For example, the attachment feature 150a includes both the diameter 152 and the depth 151. In some examples, the depth 151 is provided by a solid surface such as a bottom of the attachment feature 150a and interacts with a mechanical feature 130a (included in the mechanical features 130 shown in FIG. 1A) to position the structure 125 in a certain position such as providing an accurate positioning above the heat generating component 115 and/or the TIM 120. The depth 151 may also be provided by a shelf or other features formed in the attachment feature 150a which prevents the mechanical feature 130a from further entering the attachment feature 150a.

In some examples, the diameter 152 also interacts with the mechanical feature 130b by restricting the movement and/or depth of the mechanical feature 130b within the attachment feature 150b such that the structure 125 is positioned and fixed in the desired location. For example, the package 100 may only include one attachment feature 150 where the diameter 152 positions or disposes the structure 125 in a position over the heat generating component 115 to provide heat exchange to the package 100 as described in relation to FIG. 1C.

In an example where the structure 125 is a heat exchanging component, minimizing a bondgap between the heat generating component 115 and the structure 125 ensures that proper and efficient heat transfer is achieved. For example, as shown in FIG. 1C, a zoomed view of subsection 160, shown in FIG. 1B, and illustrates the structure 125 positioned or disposed over the heat generating component 115 and the TIM 120. Heat transfer between the structure 125 and the heat generating component 115 depends on the bondgap 170. A tightly controlled and small bondgap achieves better and more consistent heat transfer. The positioning features (e.g., the depth 151 and the diameter 152) in the attachment features 150 provide for the accurate bondgap control such as the placement/positioning of the structure 125 into the frame 105 within 15 microns accuracy to ensure the bondgap is within design constraints for the features of the structure 125 and the heat generating component 115.

Returning to FIG. 1B, the structure 125 may also include positioning features such as post stops 131, where the post stops 131 interacts with the attachment feature 150a and/or the frame 105 to position the structure 125 within the package 100 to achieve the desired function. In addition to heat exchange functions, the various positioning features may also provide a position for the structure 125 when acting a shield or housing for the package 100 among other additional structure types. Furthermore, while shown in relation to FIG. 1A-C as preformed features in the frame 105, the attachment features 150 may also be added or formed directly in the frame 105 as shown in FIG. 2.

The attachment features 150 and the preformed components may also include other potential structures in the package 100 provided via preformed features or mechanically patterned in the mold of the frame 105 including trench features which may be used for containment of epoxy/solder flow. The other potential features formed in the frame may include holes/cutouts/gaps in the entire package (such as open cutouts to make room for other packaging materials or bigger components which fit around the electrical die or other component of package 100. In another example, inscribed features such as guide marks or written marks act as vision fiducials/reference points for the package 100. Other structures could include features or cutouts around a perimeter of the frame 105 that include additional mating features to structure 125 (not shown). In some examples, the positioning features do not have to be completely contained within the frame 105 such as a hole.

Figure 2:
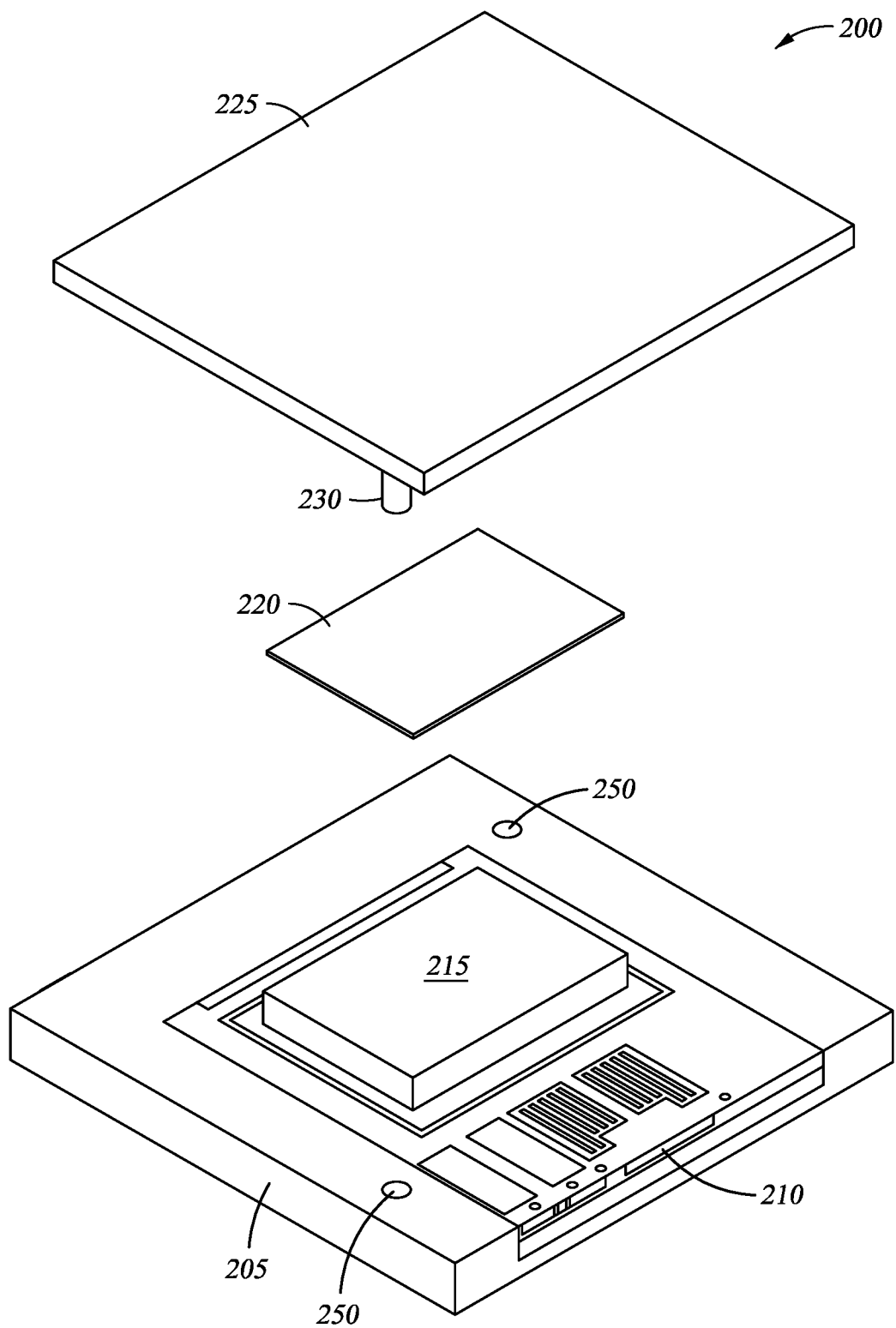
FIG. 2 illustrates an expanded view of an example electronic assembly, according to embodiments described herein.

FIG. 2 illustrates an expanded view of an example electronic assembly, according to embodiments described herein. Package 200 in FIG. 2 includes a frame 205, a die element 210, a TIM 220, and a structure 225, each of which may be substantially similar to corresponding components described in relation to FIGS. 1A-C. The frame 205 includes the attachment features 250. In some examples, the frame 205 is a FOWLP frame or reconstituted die formed from an epoxy material which is cured to form reconstituted dies, where frame 205 provides a frame/support for the die element 210 and the other components formed or attached to the frame 205 as described herein.

In contrast to the preformed components 155 in FIGS. 1A-1C, the attachment features 250 are holes, slats, drilled component, or other mechanical features, drilled or otherwise formed into the frame 205 after the frame 205 has been cured and processed. In some examples, the attachment features 250 include positioning features (e.g., a depth and/or diameter as discussed in relation to FIG. 1B) which provide for the accurate placement/positioning of the structure 225 and the mechanical features 230 into the frame 205 within 15 microns accuracy to ensure the bondgap is within design constraints for the features of the structure 225 and the heat generating component 215. As also shown in FIG. 2, the package 200 may also include two attachment features 250 where a first attachment feature provides positioning to the structure 225 and the second prevents rotation of the structure 225 and misalignment of the structure 225 in relation to the frame 205.

Figure 3A:
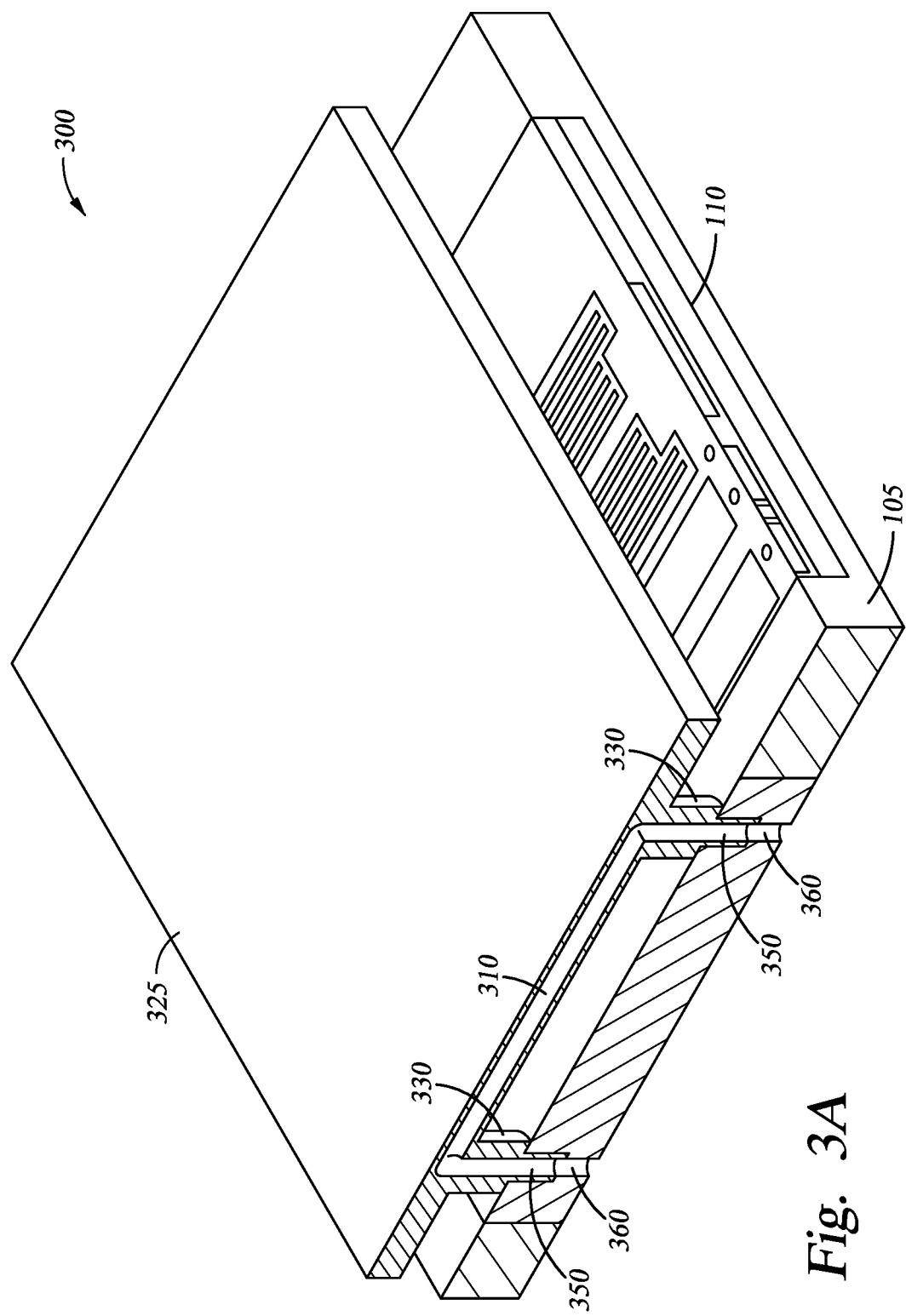
FIG. 3A illustrates an example electronic assembly with a flow channel, according to embodiments described herein.
Figure 3B:
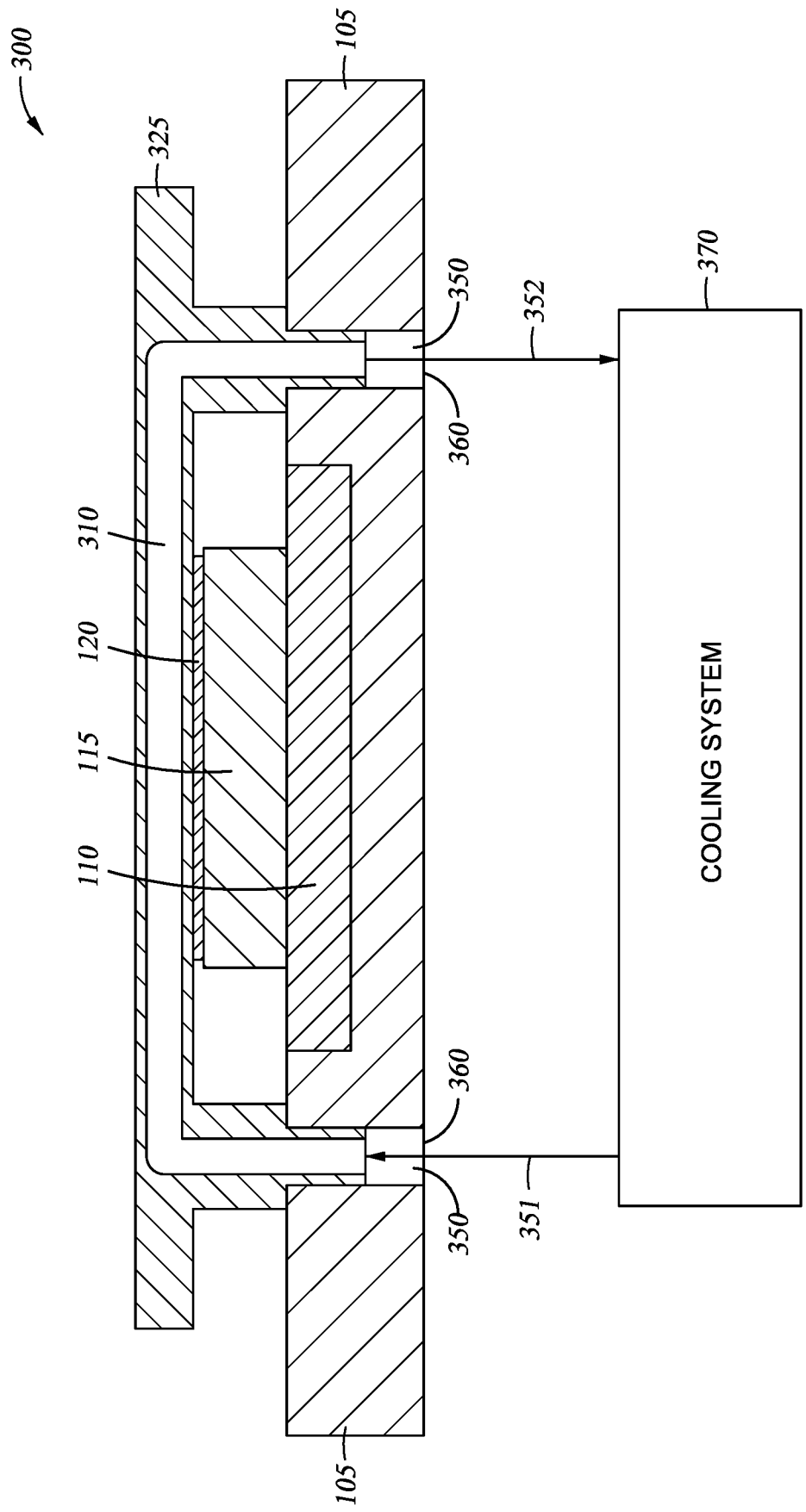
FIG. 3B illustrates a cross-section side view of an example electronic assembly with a flow channel, according to embodiments described herein.

FIG. 3A illustrates an example electronic assembly with a flow channel, package 300, and FIG. 3B illustrates a cross-section side view of an example electronic assembly with a flow channel, according to embodiments described herein. In some examples, the package 300 is an alternate form of package 100 and includes the frame 105, the die element 110, and the heat generating component 115. The package 300 also includes attachment features 350 and a structure 325 including attachment features 330. The structure 325 and attachment features 330 include a channel 310 formed into the structure 325 and through the attachment features 330 which join to a channel 360 formed in attachment features 350 and/or the frame 105. The channels 310 and 360 form a single channel that allows for a liquid coolant, such as a liquid or gas coolant, to be circulated through the structure 325 as shown in FIG. 3B. As shown an external and/or liquid coolant system, such as cooling system 370, injects liquid coolant 351 to the structure 325 where the coolant transfers heat from the structure 325 to produce warmed liquid coolant 352 back to the cooling system 370. The cooling system 370 and the channels 360 and 310 provide further cooling capabilities to the structure 325 when functioning as a heat transfer component or heat sink.

FIGS. 4A-B illustrate various views of a first phase of fabrication of an electronic assembly, according to embodiments described herein. For ease of description, reference will be made to method 900 of FIG. 9 while describing the various embodiments in FIGS. 4A-8C. FIG. 9 is a flow chart outlining general operations in an example method to produce an optical connection assembly. FIG. 4A illustrates a top view of a carrier layer wafer, such as a wafer 400, which includes a carrier layer 401 which in turn includes various die elements (e.g., die element 110) and preformed components (e.g., preformed components 155) affixed to the wafer 400. For example, a combination 405 includes a die element 410, a preformed component 450 and an attachment feature 451 affixed to the wafer carrier layer 401 as shown in FIG. 4B, which is a side view of the combination 405. In some examples the preformed component 450 and attachment feature 451 are affixed to the carrier layer 401 such that the hole or attachment feature 451 is facing the carrier layer 401. In some examples, the attachment feature 451 is covered by a portion 453 of the preformed component 450 as described below.

Referring to FIG. 9, at block 902 of method 900, a die element and at least one attachment feature are affixed to a carrier layer, where the at least one attachment feature comprises a positioning feature. For example, as shown in FIG. 4B, the die element 410 and the preformed component 450 are affixed to the carrier layer 401. The preformed component 450 includes the attachment feature 451, which may include a depth, a diameter, and other position features as described in relation to FIG. 1B. In some examples, a plurality of die elements 410 and preformed components 450 are attached to a wafer the carrier layer 401 to create multiple combinations 405 of the die elements and preformed components. In some examples, attaching/affixing the die element 410 and the preformed component 450 is done with a standard FOWLP process to place dies (e.g., photonic dies, electronic dies, etc.) and other components onto a sticky tape or carrier wafer. In some examples, the attachment feature 451 includes preformed hole/slot structures that are affixed to the carrier layer 401. The mechanical features may include the portion 453 which covers the attachment feature 451 to prevent a framing mold from entering the attachment feature 451. The placement of the components described above onto the carrier layer 401 allows for a framing mold to be cast over the components and cured as described in relation to FIGS. 5A-5B.

FIGS. 5A-B illustrate various views of a second phase of fabrication of an electronic assembly, according to embodiments described herein. FIG. 5A illustrates a top view of the second phase in the fabrication and includes the framing layer 501 deposited on the carrier layer 401 forming a wafer 500 and the various components attached to the carrier layer include the combination 405. A combination 505 includes the combination 405 in FIG. 4A and the framing layer 501 as shown in FIG. 5B, which is a side view of the combination 505. Referring to FIG. 9, a frame layer (e.g., framing layer 501) is formed by covering the die element 410 and the at least one attachment feature (e.g., preformed component 450 and/or the attachment feature 451) with a framing mold at block 904. In some examples, the framing mold fills the areas between the die element 410, the preformed component 450 and any other components attached to the carrier layer 401. In some examples, this process at block 904 is completed for a wafer to cover the multiple combinations of the die elements and preformed components 450 as shown in FIG. 5A. In some examples, the framing mold produces excess framing mold such as portion 550 which is disposed on the die element 410 and the preformed component 450. As shown, the portion 550 also includes the portion 453 which covers the attachment feature 451 to prevent a framing mold from entering the attachment feature 451.

FIGS. 6A-B illustrate various views of a third phase of fabrication of an electronic assembly, according to embodiments described herein. FIG. 6A illustrates a top view the third phase in the fabrication of an optical assembly. The wafer 600 shows the various components describe in FIGS. 4A-5B attached to the carrier layer 401 with a portion of the framing layer removed. For example, when the framing layer mold compound has cured, the framing layer 501 shown in FIG. 5B is mechanically ground or polished to remove the portion 550 of mold compound including the portion 453 covering the holes in attachment feature 451, and expose the hole structures/bottom side of the attachment feature 451) and a backside/bottom side of the die element 410. Referring to FIG. 9, at block 906, a portion of the framing mold is removed, where the removal of the portion exposes a bottom side 624 of the die element 410 and a bottom side 622 of the at least one attachment feature 651 in a preformed component 650. The process described at block 906 and shown in FIGS. 6A-6B may be done a wafer level or at an individual die level. For example, a wafer 600 may be diced into individual wafers where the combination 605 is a diced into an individual die prior to the removal of the portion 550. In another example, the wafer 600 may be diced after a portion is removed as shown in FIGS. 7A-B.

FIGS. 7A-B illustrate various views of a fourth phase of fabrication of an electronic assembly, according to embodiments described herein. FIG. 7A illustrates a top view of a fourth phase in the fabrication of an optical assembly. As shown in FIG. 7A, the wafer 700 is diced along wafer lines 701 to form individual dies such as the die 705. As shown in the side view of die 705 in FIG. 7B, the carrier layer 401 is also removed to form the die 705 as described in block 908. In some examples, each die 705 includes the die element 410, one or more connection features, such as the at least one attachment feature 651, and the remaining framing wafer 601. In some examples, the carrier layer 401 is removed at the wafer-level and the plurality of combinations are diced into a plurality of dies such as the die 705. In some examples, additional processing to form vias, redistribution layers, and/or other electronics structures are completed prior to dicing the dies such as the die 705.

Figure 8A:
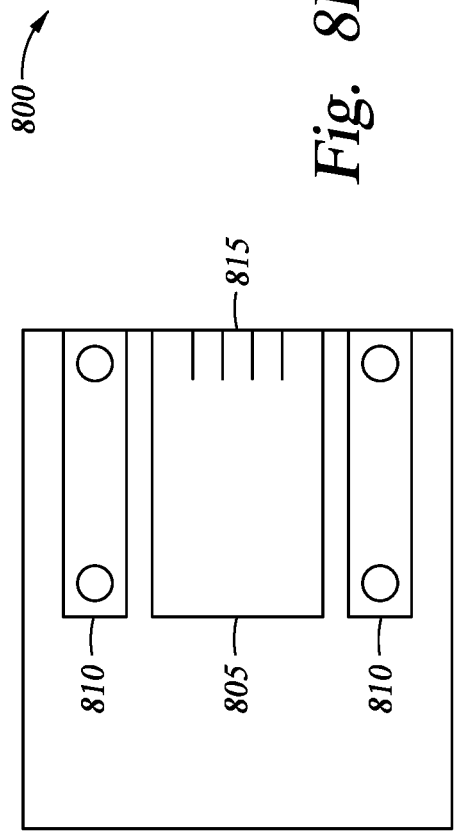
FIGS. 8A-D illustrate various views of a fifth phase of fabrication of an electronic assembly, according to embodiments described herein.

FIGS. 8A-D illustrate various views of a fifth phase of fabrication of an electronic assembly, according to embodiments described herein. FIG. 8A shows a top view of a die 800, fabricated as shown in FIGS. 4A-7B, including a die element 805, and components 810 with connection components. As shown in FIG. 8A, standard fabrication techniques may be used to add features, such as optical features 815 to the die element 805 among other features such as any additional opto-mechanical assembly that may be needed (such as chip attach, laser attach, etc.).

Figure 8B:
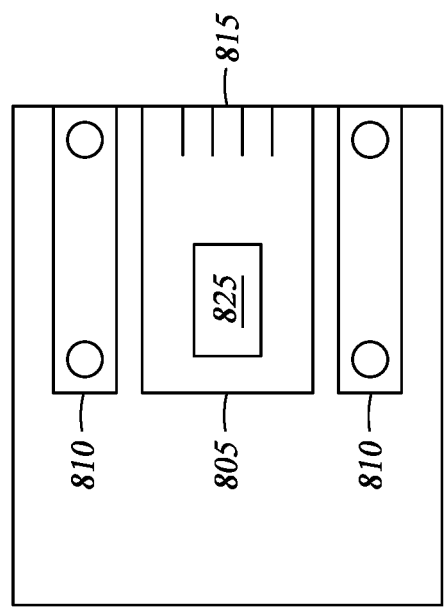
Figure 9:
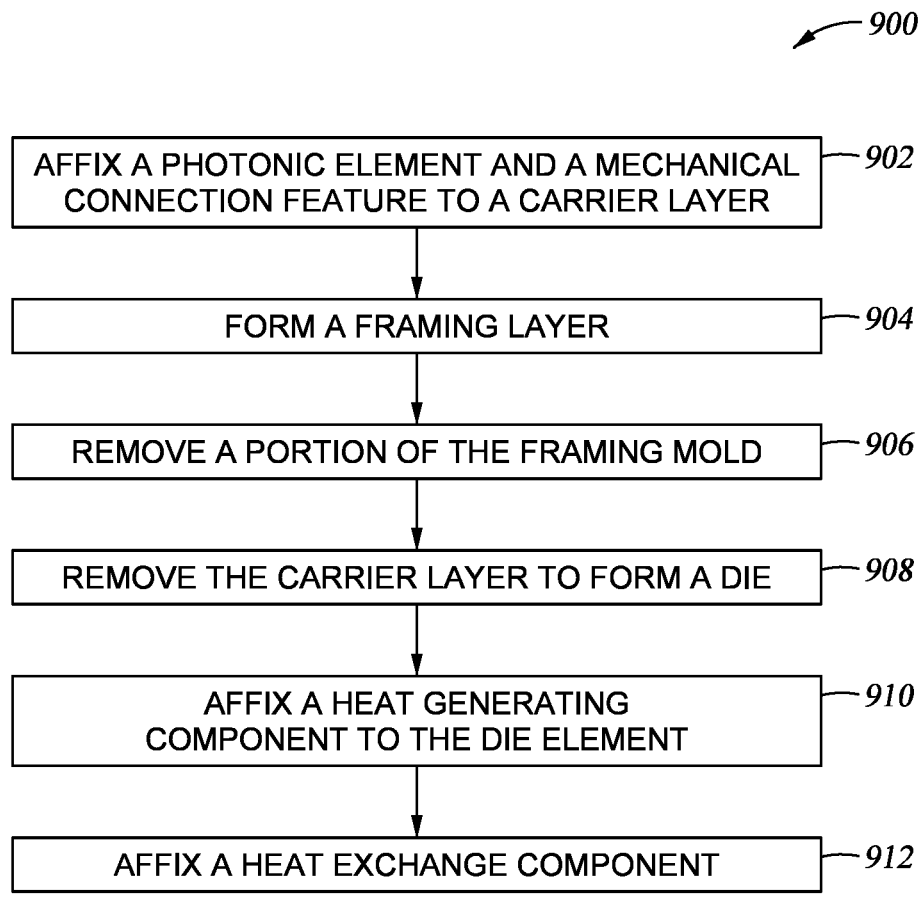
FIG. 9 is a flow chart outlining general operations in an example method to produce an optical connection assembly, according to embodiments described herein.

FIG. 8B shows a top view of the die 800 including the die element 805 and components 810 with a heat generating component 825 affixed to the die element 805. Referring to FIG. 9, as described in block 910 the heat generating component is affixed to the die element. For example, an EIC (e.g., the heat generating component 825) is affixed to a PIC (e.g., die element 805) using standard fabrication techniques which communicatively and structurally joins the EIC to the PIC.

Figure 8C:
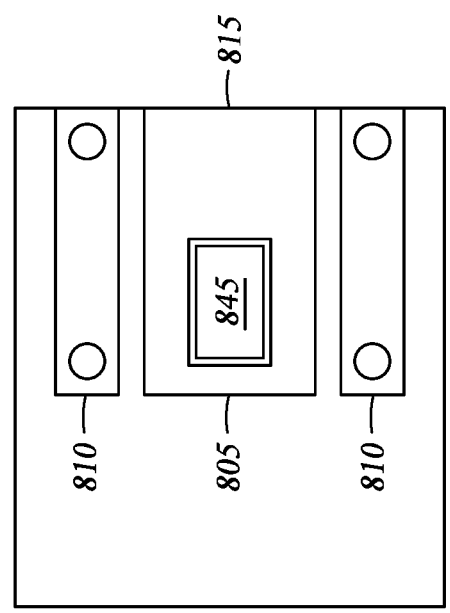

FIG. 8C shows a top view of the die 800 including the die element 805, the components 810, the heat generating component 825, and a TIM layer 845 disposed on the heat generating component 825. In some examples, the TIM layer 845 is affixed to or disposed on a surface of the heat generating component prior to affixing the heat exchange component to the at least one attachment feature. In some examples, when an additional structure and/or heat exchange component is affixed to the die 800, the additional structure is positioned to contact the thermal interface material such as the TIM layer 845.

Figure 8D:
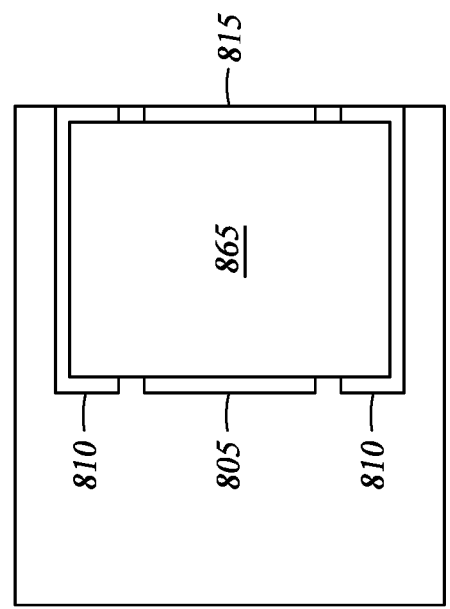

FIG. 8D shows a top view of the die 800 with an additional structure 865 joined to the component 810 using the components 810. For example as described in block 912 of FIG. 9, a heat exchange component including at least one mechanical feature is affixed to the at least one attachment feature in the component 810, where the at least one mechanical feature is positioned within the at least one attachment feature to join the additional structure 865 to the die 800. For example, as shown in FIG. 1B, the mechanical feature 130a is positioned in the attachment feature 150a to join the structure 125 to the frame 105. While shown for one die, die 800, in FIG. 8D, a plurality of heat exchange components may be affixed to a plurality of dies at a wafer level, such as prior to dicing the wafer as described in FIGS. 7A-B. As described in relation to FIGS. 1A-C, the attachment features provide the positioning and alignment to the structure 125 such that precise alignment machines and die bonders are not required to join the structure 125 to the frame 105. In some examples, the mechanical features 130 are further held in place in the attachment features 150 by an additional joining material such as an adhesive, an epoxy, solder, etc. applied to the mechanical features 130 and the attachment features 150. In some examples, the additional joining material is thermally cured and/or ultraviolet cured epoxy which provides additional joining strength between the structure 125 and frame 105. In some examples, the additional joining material may also be used to seal the channel 310 and other channels to the cooling system 370 to prevent air or liquid leakage etc.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A method for manufacturing an electronic package, comprising:
    affixing a die element to a carrier layer comprising a plurality of die elements;
    forming a framing layer by covering the die element with a framing mold;
    exposing a bottom side of the die element by removing a portion of the framing mold;
    removing the carrier layer to form a die comprising the die element and the framing layer by:
        removing the carrier layer from the plurality of die elements; and
        dicing the framing layer into single dies including the die comprising the die element, wherein the die element comprises a heat generating component and wherein the framing mold supports at least one attachment feature; and
    affixing a heat exchange component comprising at least one mechanical feature to the at least one attachment feature, wherein the at least one attachment feature positions the heat exchange component to provide heat exchange to the heat generating component.

2. The method of claim 1, wherein the carrier layer comprises a carrier layer wafer, wherein the plurality of die elements and a plurality of attachment features are affixed to the carrier layer.

3. The method of claim 2, wherein the method further comprises:

affixing a plurality of heat exchange components to the plurality of attachment features prior to dicing the framing layer into single dies.

4. The method of claim 1, wherein the method further comprises:
affixing a thermal interface material to a surface of the heat generating component prior to affixing the heat exchange component to the at least one attachment feature; and
wherein affixing the heat exchange component further comprises positioning the heat exchange component to contact the thermal interface material.

5. The method of claim 1, wherein the at least one attachment feature comprises a first attachment feature and a second attachment feature, wherein the first attachment feature comprises a positioning feature and wherein the second attachment feature prevents a rotation and a misalignment of the heat exchange component.

6. The method of claim 1, wherein the at least one attachment feature comprises three or more attachment features, wherein at least one of the three or more attachment features provides a positioning feature.

7. A method for manufacturing an electronic package, comprising:
affixing a plurality of die elements and a plurality of attachment features to a carrier wafer;
forming a framing layer by covering the plurality of die elements with a framing mold;
exposing a bottom side of the die elements by removing a portion of the framing mold;
removing the carrier wafer;
affixing at least one heat exchange component comprising at least one mechanical feature to at least one attachment feature of the plurality of attachment features, wherein the at least one attachment feature positions the heat exchange component to provide heat exchange to at least one heat generating component features; and
dicing the framing layer into single dies.

8. The method of claim 7, wherein the method further comprises:
affixing a thermal interface material to a surface of the at least one heat generating component prior to affixing the heat exchange component to the at least one attachment feature; and
wherein affixing the heat exchange component further comprises positioning the heat exchange component to contact the thermal interface material.

9. The method of claim 7, wherein the at least one attachment feature comprises a first attachment feature and a second attachment feature, wherein the first attachment feature comprises a positioning feature and wherein the second attachment feature prevents a rotation and a misalignment of the at least one heat exchange component.

10. The method of claim 7, wherein the at least one attachment feature comprises three or more attachment features, wherein at least one of the three or more attachment features provides a positioning feature.

* * * * *